(12) United States Patent
Tajiri

(10) Patent No.: US 7,642,502 B2
(45) Date of Patent: Jan. 5, 2010

(54) PHOTO RELAY HAVING AN INSULATED GATE FIELD EFFECT TRANSISTOR WITH VARIABLE IMPEDANCE

(75) Inventor: Naoya Tajiri, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/331,003

(22) Filed: Dec. 9, 2008

(65) Prior Publication Data

US 2009/0152443 A1 Jun. 18, 2009

(30) Foreign Application Priority Data

Dec. 12, 2007 (JP) ............... 2007-321294

(51) Int. Cl.
*H01J 40/14* (2006.01)
(52) U.S. Cl. .................. 250/214 R; 250/551
(58) Field of Classification Search ............ 250/214 R, 250/214 RC, 214 SG, 551; 327/109, 310, 327/432, 514; 326/68, 81; 361/56, 91.4, 361/91.5, 100
See application file for complete search history.

(56) References Cited

U.S. PATENT DOCUMENTS 4,665,316 A * 5/1987 Hodges ............... 250/551
4,804,866 A 2/1989 Akiyama
6,037,602 A 3/2000 Polce

FOREIGN PATENT DOCUMENTS

JP 2002-050952 2/2002

* cited by examiner

*Primary Examiner*—Que T Le
(74) *Attorney, Agent, or Firm*—Turocy & Watson, LLP

(57) ABSTRACT

A LED is provided to emit a light signal corresponding to an input signal. A PD receives the light signal, and generates a photovoltaic output. A MOSFET receives the photovoltaic output. A FET is provided. A first electrode of the FET is connected to the gate of the MOSFET. A second electrode of the FET is connected to a cathode of the PD through a resistor. A control electrode of the FET is connected to the cathode of the PD. A transistor is provided. A first electrode of the transistor is connected to the gate of the MOSFET. A second electrode of the transistor is connected to the source of the MOSFET. A control electrode of the transistor is connected to the second electrode of the FET. A diode is connected between the second electrode of the FET and the second electrode of the transistor.

11 Claims, 7 Drawing Sheets

PHOTO RELAY HAVING AN INSULATED GATE FIELD EFFECT TRANSISTOR WITH VARIABLE IMPEDANCE

CROSS REFERENCE TO RELATED APPLICATION

This application is based upon and claims the benefit of priority from the prior Japanese Patent Application No. 2007-321294, filed on Dec. 12, 2007, the entire contents of which are incorporated herein by reference.

FIELD OF THE INVENTION

The present invention relates to a photo relay.

DESCRIPTION OF THE BACKGROUND

A photo relay using a metal-oxide-semiconductor (MOS) transistor is well known. The MOS transistor is driven by a photovoltaic output from a photocoupler circuit as a relay contact. Such a photo relay is disclosed in Japanese Patent Application Publication No. 2002-50952.

The photo relay includes a photo diode coupler circuit, an output MOS transistor, a control resistor, a control transistor, a discharge resistor, and a discharge transistor. An impedance between a drain and a source of the output MOS transistor varies when a capacitance between a gate of the output MOS transistor and the source is charged by a photovoltaic output. The control resistor and the control transistor control charging and discharging of gate charge of the output MOS transistor. The gate charge discharged from the output MOS transistor flows in the discharge resistor and the discharge transistor.

The control resistor generates a bias voltage for turning on or off the control transistor depending on the photovoltaic output from the photocoupler circuit. The discharge resistor generates a bias voltage for turning on or off the discharge transistor depending on the photovoltaic output from the photocoupler circuit.

In the photo relay, the control resistor and the discharge resistor need to have high resistances in the order of MΩ to generate a necessary bias voltage because a current generated by a light receiving element is in the order of μA.

The control resistor and the discharge resistor with such high resistances is formed in a semiconductor chip. The control resistor and the discharge resistor occupy a large area in the semiconductor chip. As a result, there is a problem that integration of the semiconductor chip may be difficult, as the number of such resistors is large.

In addition, for the high-speed switching of the output MOS transistor, it is important to control the resistances of the control resistor and the discharge resistor. However, it may be difficult to form a plurality of resistors of high resistances in a semiconductor chip with high precision.

SUMMARY OF THE INVENTION

One aspect of the invention is to provide a photo relay including, a light emitting diode to emit a light signal corresponding to an input signal, a photovoltaic diode to receive the light signal from the light emitting diode, so as to generate a photovoltaic output, an output circuit having an insulated gate field effect transistor to receive the photovoltaic output, an impedance between a drain and a source of the insulated gate field effect transistor varying by changing a capacitance between a gate and the source of the insulated gate field effect transistor by the photovoltaic output, a field effect transistor having a first electrode, a second electrode, and a control electrode, the first electrode of the field effect transistor being connected to the gate of the insulated gate field effect transistor, the second electrode of the field effect transistor being connected to a cathode of the photovoltaic diode through a resistor, and the control electrode of the field effect transistor being connected to the cathode of the photovoltaic diode, a transistor having a first electrode, a second electrode, and a control electrode, the first electrode of the transistor being connected to the gate of the insulated gate field effect transistor, the second electrode of the transistor being connected to the source of the insulated gate field effect transistor, and the control electrode of the transistor being connected to the second electrode of the field effect transistor, and a diode being connected between the second electrode of the field effect transistor and the second electrode of the transistor.

Another aspect of the invention is to provide a photo relay including, a light emitting diode to emit a light signal corresponding to an input signal, a first photovoltaic diode to receive the light signal from the light emitting diode, so as to generate a photovoltaic output, an output circuit having an insulated gate field effect transistor to receive the photovoltaic output, an impedance between a drain and a source of the insulated gate field effect transistor varying by changing a capacitor between a gate and the source of the insulated gate field effect transistor by the photovoltaic output, a field effect transistor having a first electrode, a second electrode, and a control electrode, the first electrode of the field effect transistor being connected to the gate of the insulated gate field effect transistor, the second electrode of the field effect transistor being connected to a cathode of the first photovoltaic diode; and the control electrode of the field effect transistor being connected to the cathode of the first photovoltaic diode via a parallel circuit of a second photovoltaic diode and a resistor, the second photovoltaic diode to receive the light signal from the light emitting diode and, so as to generate a photovoltaic output, a transistor having a first electrode, a second electrode, and a control electrode, the first electrode of the transistor being connected to the gate of the insulated gate field effect transistor, the second electrode of the transistor being connected to the source of the insulated gate field effect transistor, and the control electrode of the transistor being connected to the second electrode of the field effect transistor, and a diode being connected between the second electrode of the field effect transistor and the second electrode of the transistor.

DETAILED DESCRIPTION OF THE INVENTION

Embodiments of the invention will be described with reference to the drawings.

FIRST EMBODIMENT

Figure 1:
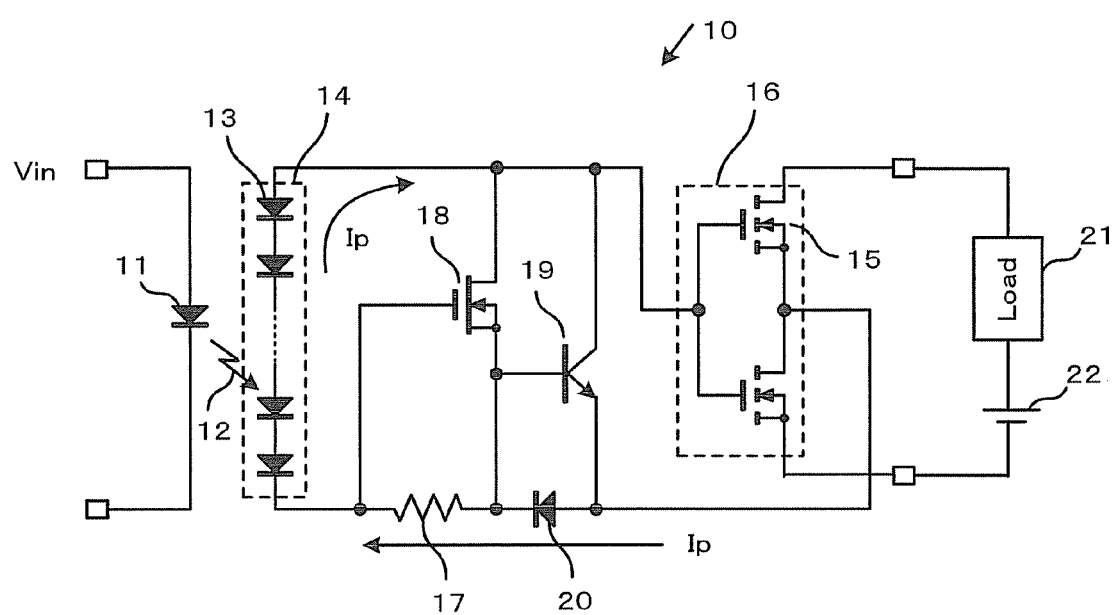
FIG. 1 is a circuit diagram showing a photo relay according to a first embodiment of the present invention.

A photo relay according to a first embodiment of the present invention will be described with reference to FIG. 1. FIG. 1 is a circuit diagram showing a photo relay.

As shown in FIG. 1, a photo relay 10 of the present embodiment includes a light emitting diode (LED) 11 emitting a light signal 12 corresponding to an input signal Vin. The photo relay 10 is provided with a light receiving unit 14 including photovoltaic diodes (PD) 13. The photovoltaic diodes 13 are connected in series to each other to receive the light signal 12 from the light emitting diode to generate a photovoltaic output depending on the intensity of the light signal 12. The photo relay 10 is further provided with an output unit 16 having an insulated gate field effect transistor (hereinafter referred to as an output MOS transistor). The impedance between the drain and the source of the output MOS transistor varies when a photovoltaic output is applied to the transistor to charge the capacitance between the gate and the source of the output MOS transistor.

The photo relay 10 further includes a field effect transistor (hereinafter referred to as a control transistor) 18 having a drain (first electrode) connected to the gate of the output MOS transistor 15, a source (second electrode) connected to the cathode (first electrode) of the photovoltaic diode 13 through a resistor (hereinafter referred to as a control resistor) 17 and a gate (control electrode) connected to the cathode. The photo relay 10 is provided with a transistor (hereinafter referred to as a discharge transistor) 19 having a collector (first electrode) connected to the gate of the output MOS transistor 15, an emitter (second electrode) connected to the source of the output MOS transistor 15 and a base (control electrode) connected to the source of the control transistor 18. The photo relay 10 is provided with a diode 20 connected between the source of the control transistor 18 and the emitter of the discharge transistor 19.

The output MOS transistor 15 is an enhancement mode N channel MOS transistor and has a gate connected to the anode of the photovoltaic diode 13.

The control transistor 18 is a depletion mode N channel MOS transistor, for example. The discharge transistor 19 is a NPN bipolar transistor, for example.

The diode 20 is a silicon PN junction diode and has an anode connected to the emitter of the discharge transistor 19 and a cathode connected to the source of the control transistor 18, for example.

The output unit 16 is a series circuit of output MOS transistors having commonly connected gates, and forms a bi-directionally conductive relay contact. A load 21 and a power source 22 are connected to the output unit 16 to on-off control a current flowing in the load 21 depending on the input signal Vin.

The operation of the photo relay 10 will then be described.

A current Ip generated from the photovoltaic diodes 13 flows from the anode to the cathode in the diode 20 when the input signal Vin is supplied to the light emitting diode 11. Consequently, a forward voltage (Vf approximately 0.6 V) is generated in the diode 20.

As a result, the base of the discharge transistor 19 is at a potential lower than that of the emitter, and thus the discharge transistor 19 does not operate and accordingly is turned off.

The current Ip generated from the photovoltaic diodes 13 also flows in the control resistor 17. Therefore, a potential difference occurs between both ends of the control resistor 17. The current Ip of approximately 1 μA and the resistance of the control resistor 17 of approximately 2 MΩ provide a potential difference of approximately 2 V, for example.

As a result, a depletion mode control transistor 18 initially turned on with a potential difference between the gate and the source of 0 V is applied with a negative bias voltage larger than a threshold value (approximately −1 V) between the gate and the source, thus disconnected between the drain and the source, and accordingly turned off.

Then, charges are stored between the gate and source of the output MOS transistor 15 due to the current Ip generated from the photovoltaic diodes 13.

As a result, the gate of the output MOS transistor 15 is at a potential higher than that of the source, and thus the impedance between the drain and source of the output MOS transistor 15 is changed from a high impedance to a low impedance.

This causes the relay contact of the output unit 16 to be closed to connect the power source 22 to the load 21. Consequently, a current flows in the load 21.

When the input signal Vin is not supplied to the light emitting diode 11, the current Ip is not generated from the photovoltaic diodes 13. There is therefore no potential difference between both ends of the control resistor 17. Consequently, the control transistor 18 becomes electrically conductive between the drain and source of the control transistor 18.

As a result, the charges stored in the gate of the output MOS transistor 15 pass through the control transistor 18 to be discharged to the cathode of the diode 20.

However, a current does not flow in a direction from the cathode to the anode of the diode 20. Consequently, the base potential of the discharge transistor 19 becomes higher than the emitter potential of the discharge transistor 19.

As a result, the discharge transistor 19 becomes conductive and thus a large amount of current can flow from the gate to the source in the output MOS transistor 15. Accordingly, the charges stored in the gate can be rapidly discharged to change at high speed the impedance between the drain and source of the output MOS transistor 15.

As described above, the photo relay 10 of the present embodiment includes the diode 20 connected between the source of the control transistor 18 and the emitter of the discharge transistor 19.

The diode 20 can be formed in a semiconductor chip in a smaller area than that of the discharge resistor used in the conventional photo relay. Consequently, the size of the semiconductor chip can be reduced while maintaining high speed switching characteristics.

Also, the tolerance range of the resistance of the control resistor 17 becomes larger, and thus it becomes easy to form the control resistor 17 in the semiconductor chip. Therefore, the photo relay 10 having a high switching speed and being suitable for integration is obtained.

SECOND EMBODIMENT

Figure 2:
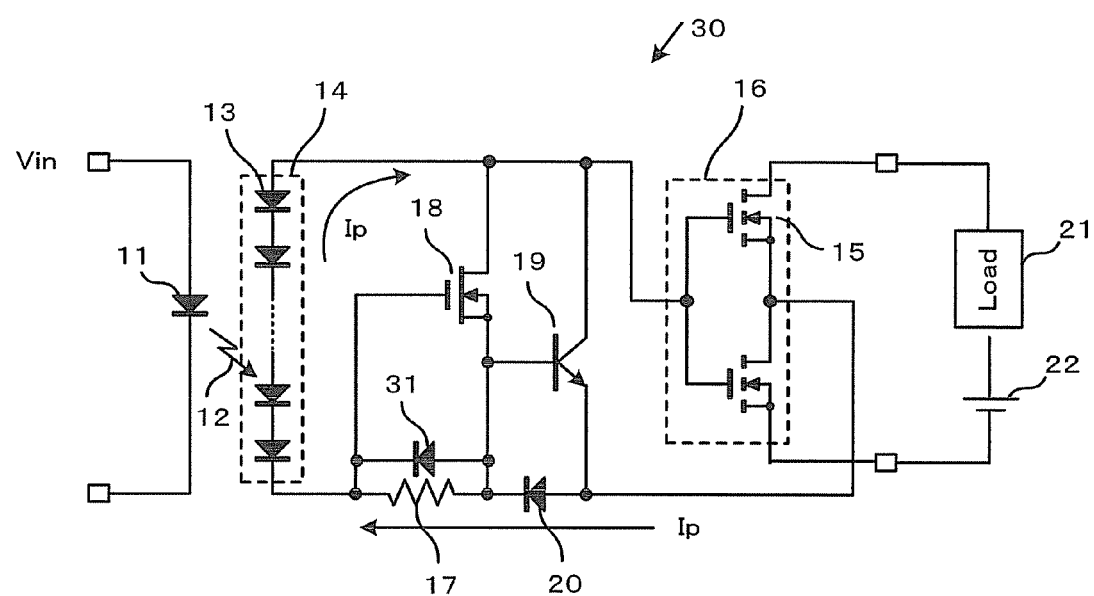
FIG. 2 is a circuit diagram showing a photo relay according to a second embodiment of the present invention.

A photo relay according to a second embodiment of the present invention will be described with reference to FIG. 2. FIG. 2 is a circuit diagram showing a photo relay.

In the present embodiment, the same parts as those of the forgoing first embodiment are given the same symbols, and description of the same parts is omitted. Description will be made of the different parts.

A difference of present embodiment from the first embodiment is that a diode is connected in parallel to a control resistor.

As shown in FIG. 2, a photo relay 30 of the present embodiment includes a diode 31 connected in parallel to the control resistor 17. The diode 31 is a silicon PN junction diode, for example, and connected in the same orientation as that of the diode 20.

When the input signal Vin is supplied to the light emitting diode 11, if exceeding the forward voltage (Vf approximately 0.6 V) of the diode 31, a potential difference generated between both ends of the control resistor 17 due to the current Ip generated from the photovoltaic diodes 13 is clamped by diode 31.

This enables a negative bias applied to the gate of the control transistor 18 to be suppressed to a certain value or less. Furthermore, a voltage loss between the gate and source of the output MOS transistor 15 can be suppressed to a certain value or less.

As described above, the photo relay 30 of the present invention includes the diode 31 connected in parallel to the control resistor 17.

This configuration can provide an advantage that the gate of the control transistor 18 is prevented from being applied with an excessive bias.

Here, description has been made of the case where one diode 31 is connected in parallel to the control resistor 17. Alternatively, a series circuit of a plurality of diodes may be connected in parallel.

Such a configuration can provide an advantage that a clamp value of the negative bias applied to the gate of the control transistor can be controlled to optimize the operation range of the control transistor 18.

Description has been made of the case where the diode 31 is a usual PN junction diode. Instead, a zener diode connected in parallel and in an inverse orientation to that of the diode 20 may be used.

That is, the anode of the zener diode is connected to the gate of the control transistor 18, and the cathode of the zener diode is connected to the source of the control transistor 18.

Design of the zener diode can be flexible in terms of a zener voltage to a certain degree and the zener diode has zero temperature characteristics.

Therefore, replacement of the series circuit of the diodes provides an advantage that the number of the diodes can be reduced. Furthermore, this replacement can provide an advantage that the temperature characteristics of the photo relay can be improved.

THIRD EMBODIMENT

Figure 3:
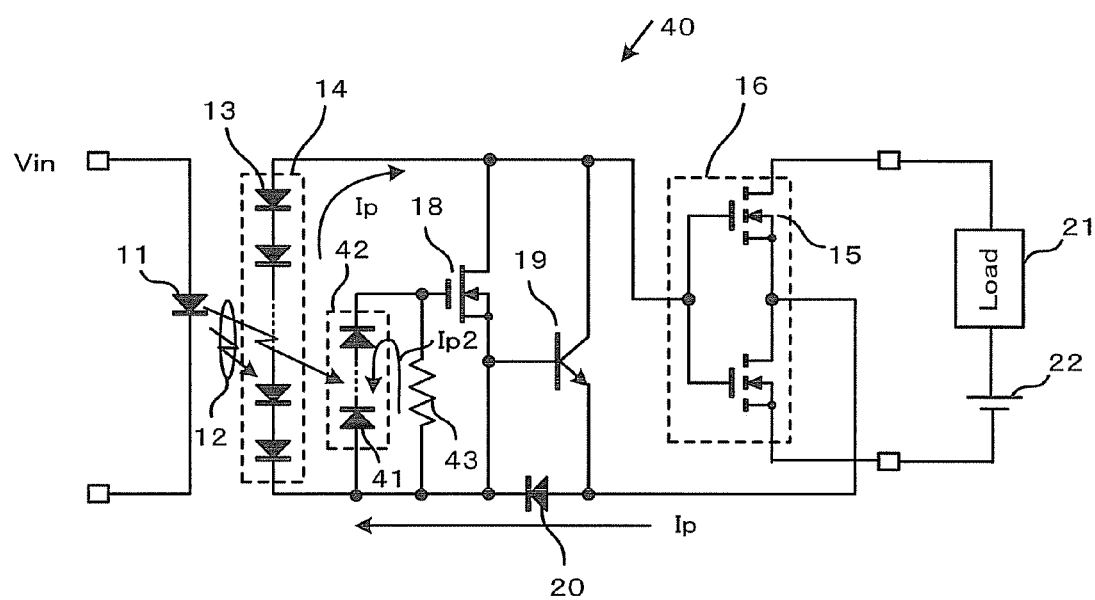
FIG. 3 is a circuit diagram showing a photo relay according to a third embodiment of the present invention.

The photo relay according to a third embodiment of the present invention will be described with reference to FIG. 3. FIG. 3 is a circuit diagram showing the photo relay.

In the present embodiment, the same parts as those of the forgoing first embodiment are given the same symbols, and description of the same parts is omitted. Description will be made about the different parts.

A difference of the present embodiment from the first embodiment is that a parallel circuit of a photovoltaic diode and a resistor is connected between the gate and source of a control transistor.

As shown in FIG. 3, a photo relay 40 of the present invention includes the control transistor 18 having a gate connected to the cathode of the photovoltaic diode 13 through a parallel circuit of a light receiving unit 42 and a resistor 43. The light receiving unit 42 includes photovoltaic diodes 41 connected in series to each other to receive the light signal 12 from the light emitting diode 11, so as to generate a photovoltaic output depending on the intensity of the light signal 12.

When the input signal Vin is supplied to the light emitting diode 11, a current Ip2 generated from the photovoltaic diodes 41 flows in the resistor 43, and thus a potential difference is generated between both ends of the resistor 43.

As a result, a depletion mode control transistor 18 initially turned on with a potential difference between the gate and the source of 0 V is applied with a negative bias voltage larger than a threshold value (approximately −1 V) between the gate and the source, thus disconnected between the drain and the source, and accordingly turned off.

When the input signal Vin is not supplied to the light emitting diode 11, the current Ip2 is not generated from the photovoltaic diodes 41. There is therefore no potential difference between both ends of the resistor 43. Consequently, the control transistor 18 becomes electrically conductive between the drain and source.

As a result, the charges stored in the gate of the output MOS transistor 15 pass through the control transistor 18 to be discharged to the cathode of the diode 20.

As described above, the photo relay 40 of the present embodiment provides an advantage that the operation of the control transistor 18 can be optimized independently of the output unit 16, since the control transistor 18 is turned on and off by the current Ip2 generated from the photovoltaic diodes 41.

Furthermore, the photo relay 40 of the present embodiment provides an advantage that a voltage loss can be reduced between the gate and source of the output MOS transistor 15.

Specifically, in the control resistor 17 shown in FIG. 1, the control transistor 18 is deeply and negatively biased to be made overdriven when the current Ip from the photovoltaic diodes 13 is excessive, and thus delay occurs when the control transistor 18 is turned on. Furthermore, a voltage loss is generated between the gate and source of the output MOS transistor 15.

On the other hand, in the present embodiment, a negative bias voltage of the control transistor 18 can be determined regardless of the current Ip from the photovoltaic diodes 13. Therefore, the control transistor 18 is not made overdriven and thus can optimally be turned on. Furthermore, a voltage loss is not generated between the gate and source of the output MOS transistor 15.

In the aforementioned embodiments, description has been made of the case where the control transistor 18 is a depletion mode insulated gate field effect transistor. The present invention is not limited to this but a junction field effect transistor may be employed.

Figure 4:
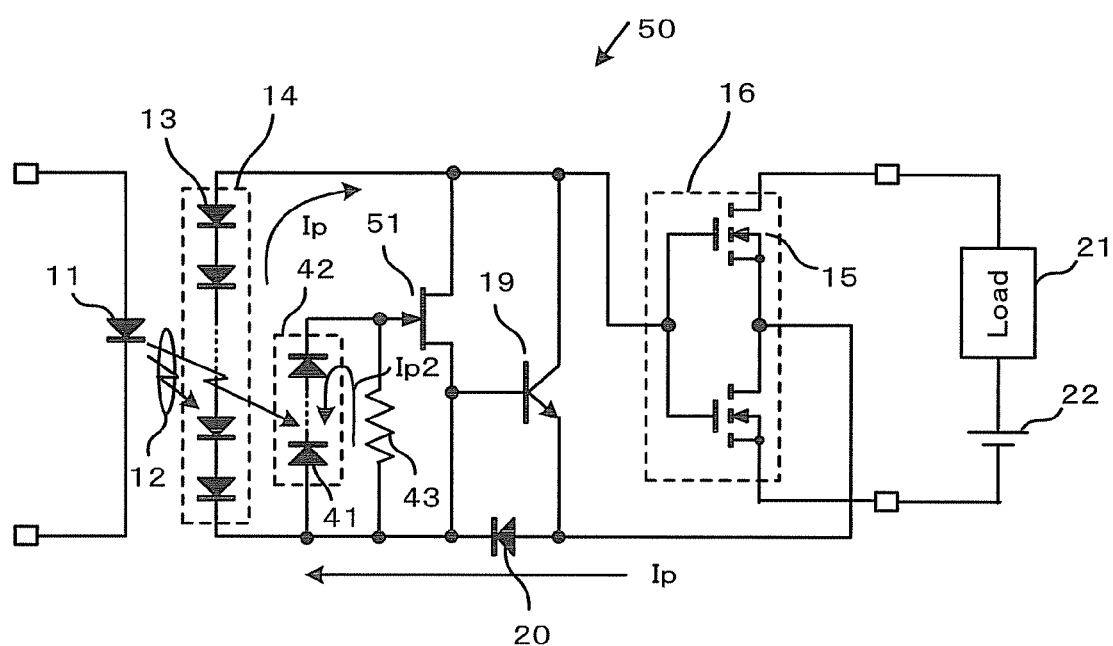
FIG. 4 is a circuit diagram showing another photo relay according to the present invention.

FIG. 4 is a circuit diagram showing a photo relay 50 having a N channel junction field effect transistor as a control transistor 51.

The junction field effect transistor 51 is normally-on and operates in the same manner as the depletion mode N channel insulated gate field effect transistor.

Description has been made of the case where the discharge transistor 19 is a bipolar transistor but an insulated gate field effect transistor may be employed.

Figure 5:
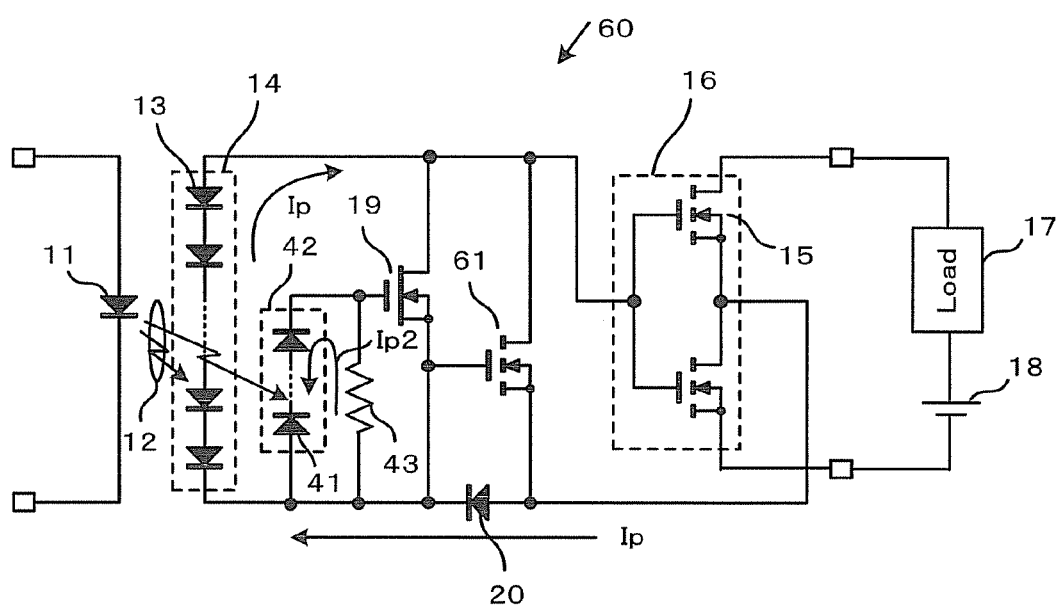
FIG. 5 is a circuit diagram showing still another photo relay according to the present invention.

FIG. 5 is a circuit diagram showing a photo relay 60 having an enhancement mode N channel insulated gate field effect transistor as a discharge transistor 61.

In addition, description has been made of the case where the channel of the field effect transistor is a N channel but a P channel may be employed. Description has been made of the case where the bipolar transistor is NPN type but a PNP bipolar transistor may be employed.

In such a case, as widely known, the control transistor is connected so that a potential difference between both ends of the control resistor 17 generated by the current Ip generated from the photovoltaic diodes 13 causes the control transistor to be turned off depending on polarity. The discharge transistor is connected so that a potential difference between both ends of the diode 20 generated by the current Ip generated from the photovoltaic diodes 13 causes the discharge transistor to be turned off depending on polarity.

Similarly, the control transistor is connected so that a potential difference generated between both ends of the resistor 43 generated by the current Ip2 generated from the photovoltaic diodes 41 causes the control transistor to be turned off.

Figure 6:
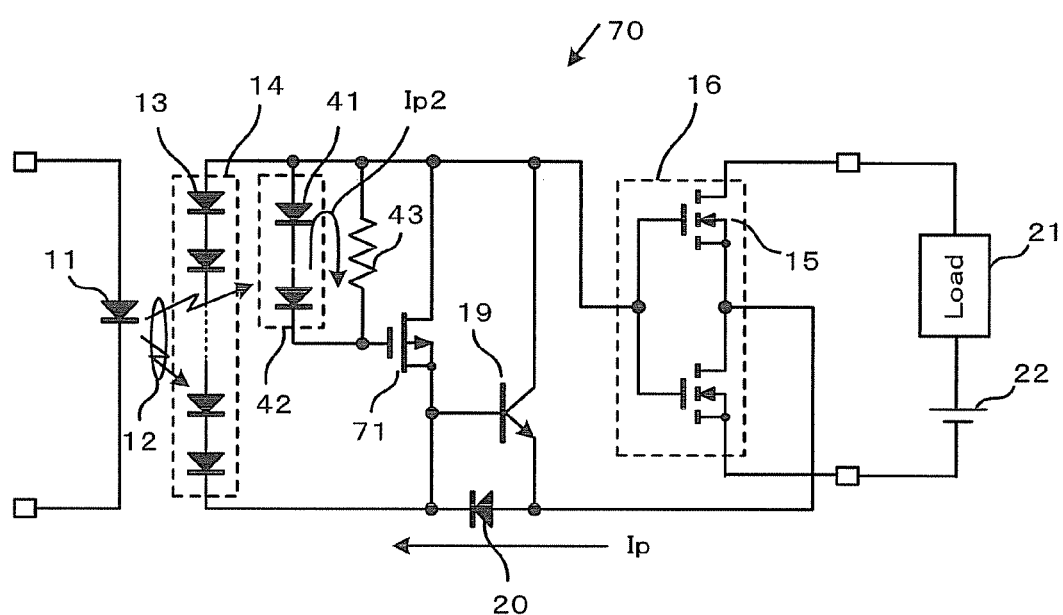
FIG. 6 is a circuit diagram showing yet another photo relay according to the present invention.

FIG. 6 is a circuit diagram showing a photo relay 70 having a depletion mode P channel insulated gate field effect transistor as a control transistor 71.

Figure 7:
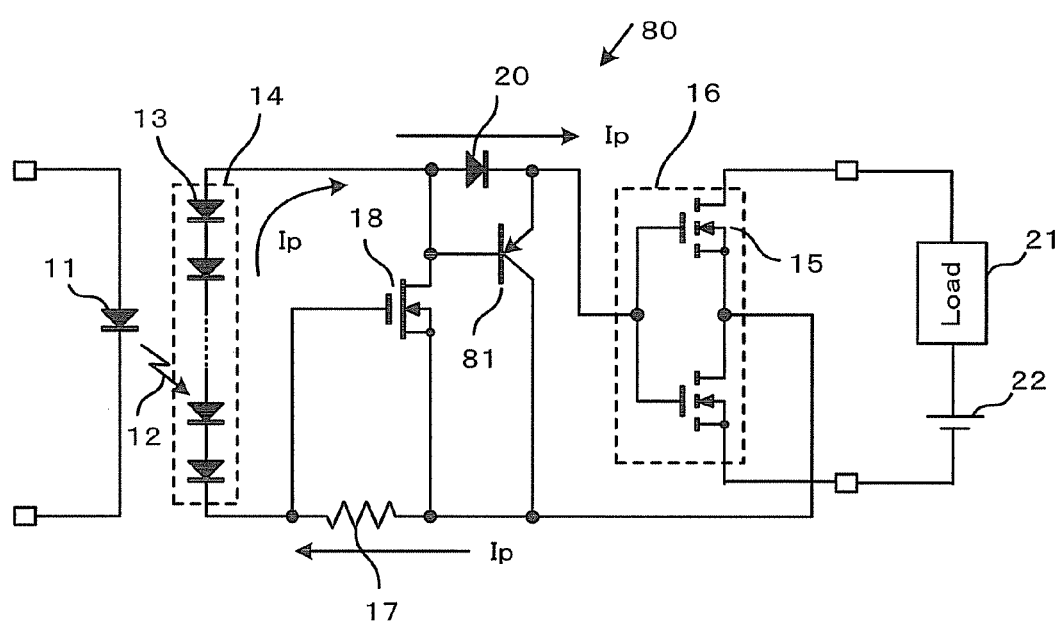
FIG. 7 is a circuit diagram showing still yet another photo relay according to the present invention.

FIG. 7 is a circuit diagram showing a photo relay 80 having a PNP bipolar transistor as a discharge transistor 81.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A photo relay, comprising:
   a light emitting diode to emit a light signal corresponding to an input signal;
   a photovoltaic diode to receive the light signal from the light emitting diode, so as to generate a photovoltaic output;
   an output circuit having an insulated gate field effect transistor to receive the photovoltaic output, an impedance between a drain and a source of the insulated gate field effect transistor varying by changing a capacitance between a gate and the source of the insulated gate field effect transistor by the photovoltaic output;
   a field effect transistor having a first electrode, a second electrode, and a control electrode, the first electrode of the field effect transistor being connected to the gate of the insulated gate field effect transistor, the second electrode of the field effect transistor being connected to a cathode of the photovoltaic diode through a resistor, and the control electrode of the field effect transistor being connected to the cathode of the photovoltaic diode;
   a transistor having a first electrode, a second electrode, and a control electrode, the first electrode of the transistor being connected to the gate of the insulated gate field effect transistor, the second electrode of the transistor being connected to the source of the insulated gate field effect transistor, and the control electrode of the transistor being connected to the second electrode of the field effect transistor; and
   a diode being connected between the second electrode of the field effect transistor and the second electrode of the transistor.

2. A photo relay according to claim 1, further comprising;
   a diode being connected in parallel to the resistor.

3. A photo relay according to claim 1, wherein the field effect transistor is a depletion mode insulated gate field effect transistor.

4. A photo relay according to claim 1, wherein the field effect transistor is a junction field effect transistor.

5. A photo relay according to claim 1, wherein the transistor is a bipolar transistor.

6. A photo relay according to claim 1, wherein the transistor is a field effect transistor.

7. A photo relay, comprising:
   a light emitting diode to emit a light signal corresponding to an input signal;
   a first photovoltaic diode to receive the light signal from the light emitting diode, so as to generate a photovoltaic output;
   an output circuit having an insulated gate field effect transistor to receive the photovoltaic output, an impedance between a drain and a source of the insulated gate field effect transistor varying by changing a capacitor between a gate and the source of the insulated gate field effect transistor by the photovoltaic output;
   a field effect transistor having a first electrode, a second electrode, and a control electrode, the first electrode of the field effect transistor being connected to the gate of the insulated gate field effect transistor, the second electrode of the field effect transistor being connected to a cathode of the first photovoltaic diode, and the control electrode of the field effect transistor being connected to the cathode of the first photovoltaic diode via a parallel circuit of a second photovoltaic diode and a resistor, the second photovoltaic diode to receive the light signal from the light emitting diode and, so as to generate a photovoltaic output;
   a transistor having a first electrode, a second electrode, and a control electrode, the first electrode of the transistor being connected to the gate of the insulated gate field effect transistor, the second electrode of the transistor being connected to the source of the insulated gate field effect transistor, and the control electrode of the transistor being connected to the second electrode of the field effect transistor; and
   a diode being connected between the second electrode of the field effect transistor and the second electrode of the transistor.

8. A photo relay according to claim 7, wherein the field effect transistor is a depletion mode insulated gate field effect transistor.

9. A photo relay according to claim 7, wherein the field effect transistor is a junction field effect transistor.

10. A photo relay according to claim 7, wherein the transistor is a bipolar transistor.

11. A photo relay according to claim 7, wherein the transistor is a field effect transistor.

* * * * *